United States Patent [19]
Morishita

[11] Patent Number: 6,154,411
[45] Date of Patent: Nov. 28, 2000

[54] BOOSTING CIRCUIT COMPENSATING FOR VOLTAGE FLUCTUATION DUE TO OPERATION OF LOAD

[75] Inventor: Fukashi Morishita, Hyogo, Japan

[73] Assignee: Mitsubishi Denki Kabushiki Kaisha, Tokyo, Japan

[21] Appl. No.: 09/324,802

[22] Filed: Jun. 3, 1999

[30] Foreign Application Priority Data

Dec. 7, 1998 [JP] Japan ................................. 10-347007

[51] Int. Cl.⁷ .................................................. G11C 7/00
[52] U.S. Cl. ................. 365/226; 365/189.09; 365/189.11
[58] Field of Search ................................. 365/226, 239, 365/191, 227, 241, 189.06, 189.11, 189.09

[56] References Cited

U.S. PATENT DOCUMENTS 5,307,315 4/1994 Oowaki et al. ..................... 365/189.09
5,889,719 3/1999 Yoo et al. ................................ 365/226

FOREIGN PATENT DOCUMENTS 2-121188 5/1990 Japan .
9-308225 11/1997 Japan .

*Primary Examiner*—David Nelms
*Assistant Examiner*—Thong Le
*Attorney, Agent, or Firm*—McDermott, Will & Emery

[57] ABSTRACT

A boosting circuit is provided with a voltage detection circuit, first through fourth oscillators, and first through fourth charge pump circuits. The voltage detection circuit compares each of the first through fourth voltages obtained by dividing a boosted voltage with a reference voltage, and generates first through fourth activation signals. The first through fourth oscillators output pulse signals at first through fourth frequencies, respectively, as first through fourth drive signals. The first through fourth charge pump circuits operate in response to the first through fourth drive signals, respectively, and boost the boosted voltage. Accordingly, it is possible to provide a stable boosted voltage, with suppressing over shoot and under shoot with respect to the boosted voltage as a target.

11 Claims, 7 Drawing Sheets

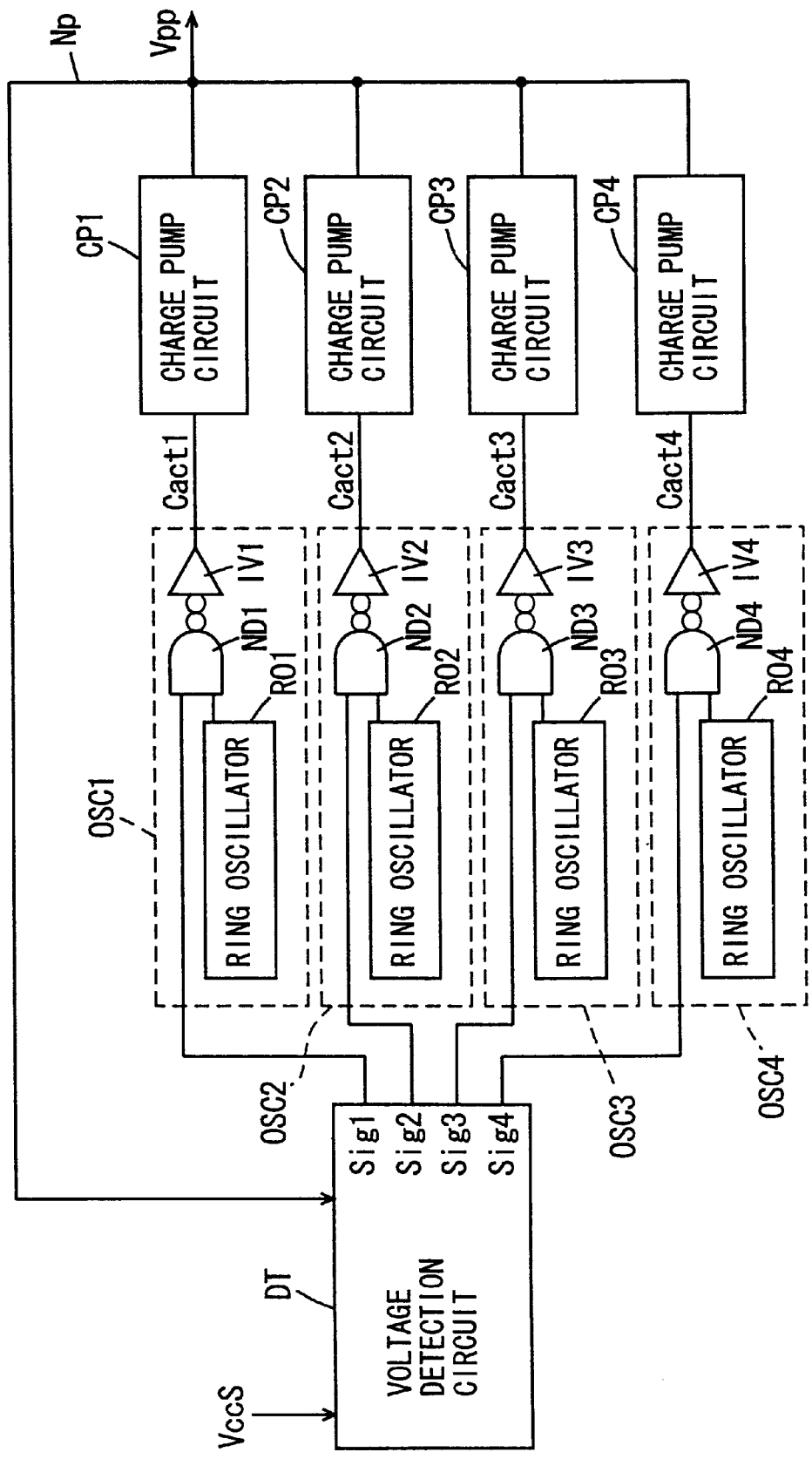
F I G. 1

BOOSTING CIRCUIT COMPENSATING FOR VOLTAGE FLUCTUATION DUE TO OPERATION OF LOAD

BACKGROUND OF THE INVENTION

1. Field of the Invention

The present invention relates to a boosting circuit, and more particularly to a boosting circuit that compensates for voltage fluctuation due to operation of load.

2. Description of the Background Art

A semiconductor memory device called a DRAM (dynamic random access memory) is formed using primarily a CMOS process. A memory cell transistor being a component thereof is often formed with a MOS transistor of only an N channel type to reduce chip area. To accurately write data at an H (logical high) level into a memory cell, a voltage that is higher than a normal H level or power supply voltage level (hereinafter, referred to as a "boosted voltage") is supplied to the gate of the memory cell transistor. When a threshold voltage of the memory cell transistor is expressed as Vthc and a voltage level of data at the H level to be written into the memory cell as VccS, this boosted voltage Vpp can be expressed as $$Vpp=VccS+Vthc+\alpha.$$

Here, $\alpha$ represents a margin.

This boosted voltage Vpp cannot be set at a large value from the standpoint of the breakdown voltage of gate oxide film in the memory cell transistor. In addition, in the case where $$\text{boosted voltage } Vpp<VccS+Vthc(\alpha<0),$$

data at the H level cannot be written back to the memory cell completely. In view of the foregoing, in the case where the internal power supply voltage VccS is 2.0V and the thickness of oxide film of the memory cell transistor is 70 Å, for example, it is reasonable to set boosted voltage Vpp on the order of 3.5V. Normally, the boosted voltage Vpp is generated in a boosting circuit formed on the same chip. The level of boosted voltage Vpp is monitored within the chip, and the boosting circuit is configured to operate when it drops below its prescribed set level to maintain the boosted voltage Vpp at the set level.

FIG. 7 is a block diagram showing an exemplary configuration of such boosting circuit. It should be understood that the boosting circuit shown in FIG. 7 is identical to the one illustrated in *Ultra LSI Memory* (by Kiyoo Ito, Baifukan, 1994, p.317, FIG. 4.56). In this circuit, the voltage level of the boosted voltage Vpp is detected by a level monitor LM, and when the level of detected boosted voltage Vpp is lower than a prescribed detection level, a ring oscillator RS starts to operate, and in response, a pumping capacitor Cp in a booster circuit BC is driven. As a result, the level of boosted voltage Vpp increases. When the level of boosted voltage Vpp reaches the prescribed level, level monitor LM causes ring oscillator RS to stop operation, and thus, pumping capacitor Cp finishes boosting.

In a conventional boosting circuit, one detection level has been set in advance, and whether to operate the boosting circuit or not is determined depending on whether the level of boosted voltage is lower than the detection level or not. In such boosting circuit, however, even when the boosted voltage Vpp is only slightly below the detection level, boosted voltage Vpp is unnecessarily increased, because boosted voltage Vpp is boosted by booster circuit BC having a large driving capability, or, due to a response lag of level monitor LM per se. This results in boosted voltage Vpp that appears to fluctuate in a large amount with respect to a desired set voltage. Further, since the boosting capability of booster circuit BC is designed based on the minimal cycle of DRAM in a general specification, booster circuit BC having a large driving capability is used to conduct boosting even when the DRAM is operating in an extremely slow cycle. This leads to unnecessary voltage fluctuation. These situations are undesirable from the standpoints that the upper limit of boosted voltage is set because of its reliability, and the lower limit is set to write data at an H level in a stable state.

To smooth out the fluctuation of boosted voltage due to the operation of boosting circuit as described above, there has been proposed a solution to insert a capacitor between a boosted node receiving the boosted voltage and a ground node. It is difficult, however, to insert such capacitor having an extremely large capacitance in the modern art where further downscaling of chip size has been required.

SUMMARY OF THE INVENTION

The present invention is directed to solve the above-described problems. An object of the present invention is to provide a boosting circuit capable of supplying a stable boosted voltage, with suppressing over shoot and under shoot with respect to the boosted voltage as a target.

The boosting circuit according to the present invention includes a boosted node, a voltage detection circuit, and a booster circuit. The boosted node receives a voltage that is higher than a power supply voltage. The voltage detection circuit includes a voltage divider and a plurality of comparators. The voltage divider receives the voltage of the boosted node and generates a plurality of voltages each lower than the voltage at the boosted node and different from one another. The plurality of comparators is provided corresponding to the plurality of voltages, and each comparator compares the corresponding voltage with a reference voltage, and generates an activation signal when the corresponding voltage is lower than the reference voltage. The booster circuit boosts the voltage of the boosted node with a driving capability that is in accordance with the activation signals from the plurality of comparators.

In the boosting circuit, when the voltage at boosted node drops, the levels of the plurality of voltages generated from the voltage divider drop in response. Of the plurality of comparators, a comparator having received a voltage that is lower than the reference voltage from the voltage divider generates the activation signal. The booster circuit then boosts the voltage at the boosted node with driving capability that is in accordance with the activation signal. That is, when the voltage at boosted node drops slightly below a target value, the voltage at boosted node is boosted with a small driving capability, and when it drops in a large amount, the voltage at boosted node is boosted with a large driving capability. Accordingly, over shoot and under shoot with respect to the target boosted voltage can be suppressed, and thus, a stable boosted voltage can be supplied.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an entire configuration of a boosting circuit according to the first embodiment of the present invention.

DESCRIPTION OF THE PREFERRED EMBODIMENTS

Figure 2:
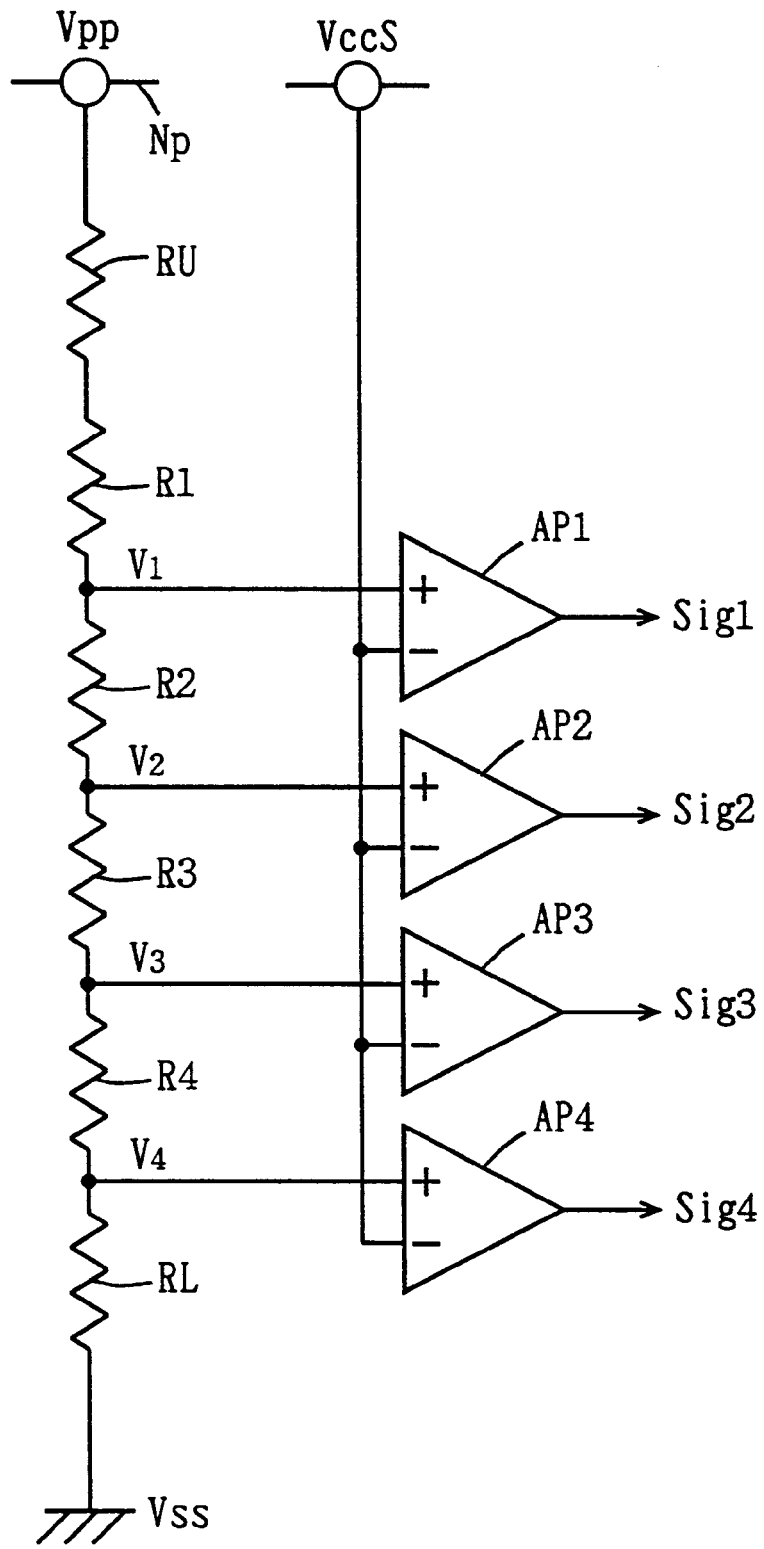
FIG. 2 is a block diagram showing a configuration of the voltage detection circuit shown in FIG. 1.

Hereinafter, embodiments of the present invention will be described in detail with reference to the accompanying drawings. In the drawings, same reference characters denote same or corresponding portions, and description thereof will not be repeated.

First Embodiment

FIG. 1 is a block diagram showing an entire configuration of a boosting circuit according to the first embodiment of the present invention. Referring to FIG. 1, the boosting circuit includes a voltage detection circuit DT, oscillators OSC1 to OSC4, and charge pump circuits CP1 to CP4. Voltage detection circuit DT receives a voltage Vpp of a boosted node Np (hereinafter, referred to as a "boosted voltage") and a reference voltage VccS, and generates activation signals Sig1 to Sig4. Oscillator OSCi (i=1 to 4) includes a ring oscillator ROi, a NAND circuit NDi, and an inverter IVi. Ring oscillator ROi is composed of an odd number of stages of inverters, and generates a pulse signal at a frequency fi. NAND circuit NDi provides the NAND of activation signal Sigi and an output of ring oscillator ROi. Inverter IVi inverts the output of NAND circuit NDi and outputs the inverted output as a drive signal Cacti.

Frequency fi of the pulse signal generated from ring oscillator ROi can be adjusted by altering the ratio between channel width and channel length of a transistor forming an inverter circuit within ring oscillator ROi. Here, f1>f2>f3>f4.

Charge pump circuit CPi operates in response to drive signal Cacti, and boosts boosted voltage Vpp.

FIG. 2 is a block diagram showing a configuration of voltage detection circuit DT shown in FIG. 1. Referring to FIG. 2, voltage detection circuit DT includes resistors RU, R1 to R4, RL, and comparison circuits AP1 to AP4. Resistors RU, R1 to R4, and RL are connected in series between boosted node Np and ground node Vss, in the order from boosted node Np side, resistors RU, R1, R2, R3, R4, and RL. Comparison circuit AP1 compares a voltage V1 at an interconnection node of resistors R1 and R2 with reference voltage VccS, and generates an activation signal Sig1 when V1<VccS. Comparison circuit AP2 compares a voltage V2 of an interconnection node of resistors R2 and R3 with reference voltage VccS, and generates an activation signal Sig2 when V2<VccS. Comparison circuit AP3 compares a voltage V3 at an interconnection node between resistors R3 and R4 with reference voltage VccS, and generates an activation signal Sig3 when V3<VccS. Comparison circuit AP4 compares a voltage V4 of an interconnection node between resistors R4 and RL with reference voltage VccS, and generates an activation signal Sig4 when V4<VccS. Reference voltage VccS is generated by a voltage down converter as a voltage of data at an H level to be written into a memory cell, for example.

As described above, voltage detection circuit DT according to the first embodiment divides boosted voltage Vpp into voltages V1 to V4 by resistors RU, R1 to R4 and RL, and compares these voltages V1 to V4 with reference voltage VccS by comparison circuits AP1 to AP4, respectively. Reference voltage VccS is not the one generated solely for this voltage detection circuit DT. Thus, voltage detection circuit DT can be realized with an extremely simple configuration.

Figure 3:
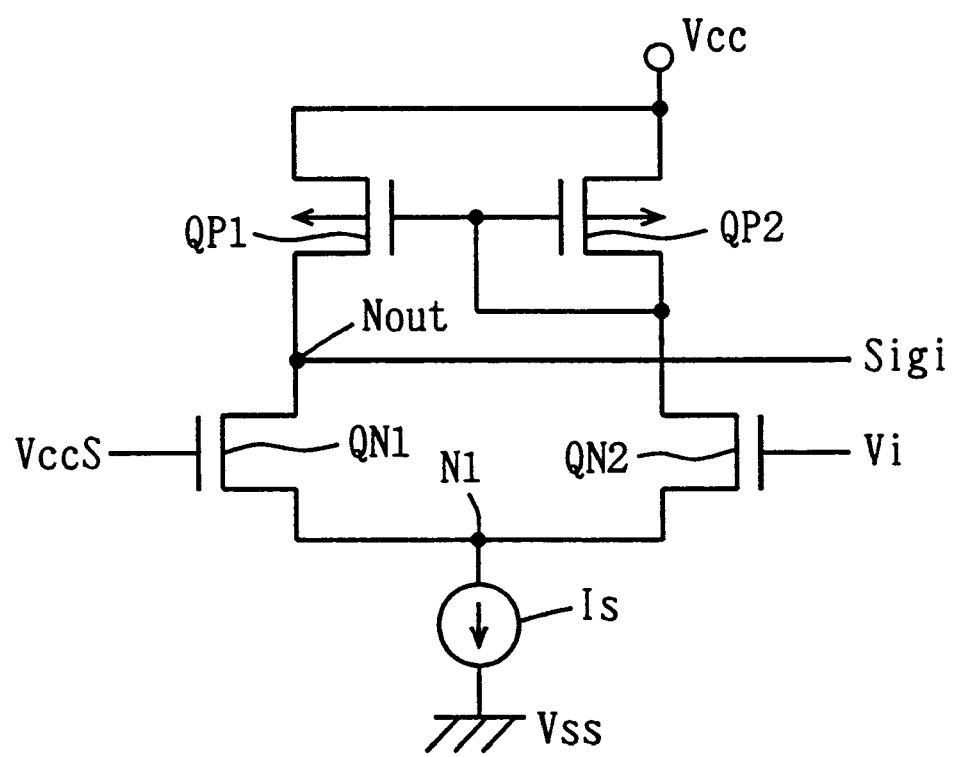
FIG. 3 is a circuit diagram showing a configuration of the comparison circuit shown in FIG. 2.

FIG. 3 is a circuit diagram showing a configuration of comparison circuit APi (i=1 to 4) shown in FIG. 2. Referring to FIG. 3, comparison circuit APi includes P channel MOS transistors QP1 and QP2, N channel MOS transistors QN1 and QN2, and a constant-current source Is. P channel MOS transistor QP1 is connected between a power supply node Vcc and an output node Nout, and has its gate connected to a gate of P channel MOS transistor QP2. N channel MOS transistor QN1 is connected between output node Nout and a node N1, and receives reference voltage VccS at its gate. P channel MOS transistor QP2 and N channel MOS transistor QN2 are connected in series between power supply node Vcc and node N1. P channel MOS transistor QP2 has its drain connected to a gate of its own. N channel MOS transistor QN2 receives at its gate the voltage Vi (i=1 to 4) shown in FIG. 2. Constant-current source Is is provided between node N1 and a ground node Vss. Comparison circuit APi is a current mirror amplifier. When voltage Vi that is supplied to the gate of N channel MOS transistor QN2 is equal to or greater than reference voltage VccS that is supplied to the gate of N channel MOS transistor QN1, activation signal Sigi at an L level is provided to output node Nout. When voltage Vi is smaller than reference voltage VccS, activation signal Sigi at an H level is provided to output node Nout.

Figure 4:
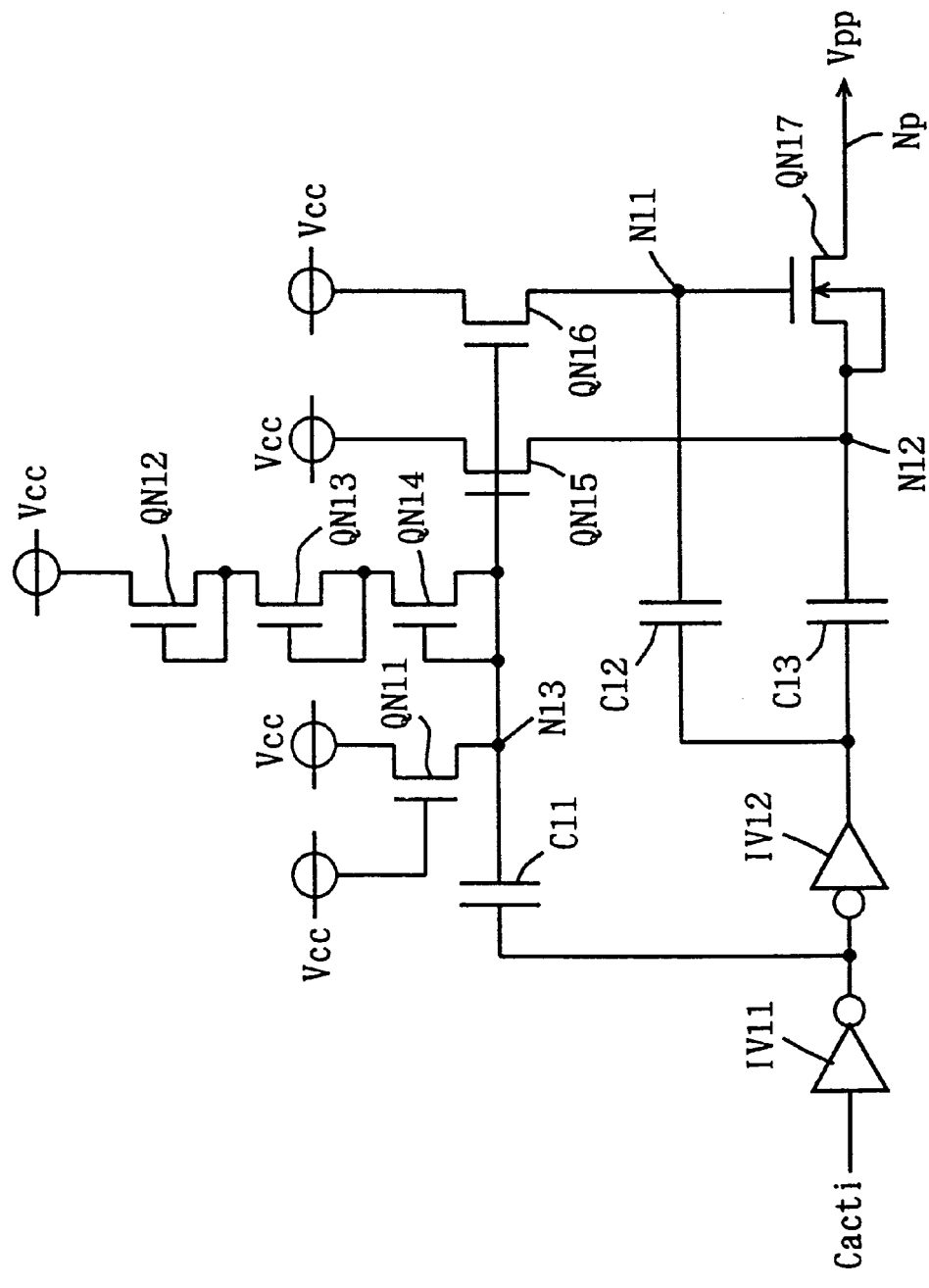
FIG. 4 is a block diagram showing a configuration of the charge pump circuit shown in FIG. 1.

FIG. 4 is a block diagram showing a configuration of charge pump circuit CPi (i=1 to 4) shown in FIG. 1. Referring to FIG. 4, charge pump circuit CPi includes N channel MOS transistors QN11 to QN17, capacitors C11 to C13, and inverters IV11 and IV12. Inverter IV11 inverts drive signal Cacti. Inverter IV12 inverts an output of inverter IV11. N channel MOS transistor QN11 is connected between power supply node Vcc and a node N13, and has its gate connected to power supply node Vcc. N channel MOS transistors QN12 to QN14 are connected in series between power supply node Vcc and node N13, each having its gate and drain connected to each other. N channel MOS transistor QN15 is connected between power supply node Vcc and a node N12, and has its gate receiving the voltage of node N13. N channel MOS transistor QN16 is connected between power supply node Vcc and node N11, and receives at its gate the voltage of node N13. N channel MOS transistor QN17 is connected between node N12 and boosted node Np, and has its gate receiving the voltage at node N11. Capacitor C11 is connected between an output node of inverter IV11 and node N13. Capacitor C12 is connected between an output node of inverter IV12 and node N11. Capacitor C13 is connected between the output node of inverter IV12 and node N12.

In charge pump circuit CPi, nodes N11 and N12 are precharged to power supply voltage Vcc when drive signal Cacti is at an L level. Nodes N11 and N12 are boosted to 2 Vcc when drive signal Cacti goes to an H level, whereby voltage Vpp at boosted node Np becomes 2 Vcc−Vth. Note that Vth represents a threshold voltage of N channel MOS transistor QN17.

Now, the operation of boosting circuit having the above-described configuration will be described.

Hereinafter, resistance values of resistors RU, R1, R2, R3, R4 and RL are expressed as ru, r1, r2, r3, r4 and rl, respectively. Further, ΣR=ru+r1+r2+r3+r4+rl.

when $$Vpp \geq (\Sigma R/rl) \times VccS: \quad (1)$$

i.e., when V4≧VccS.

In this case, the level of boosted voltage Vpp is sufficient for writing data into a memory cell, and thus, the boosting circuit conducts no boosting. That is, activation signals Sig1 to Sig4 all attain an L level since voltages V1 to V4 are all equal to or higher than reference voltage VccS. As a result, charge pump circuits CP1 to CP4 do not operate.

when $$(\Sigma R/rl) \times VccS > Vpp \geq (\Sigma R/(r4+rl)) \times VccS: \quad (2)$$

i.e., when V3≧VccS>V4.

When boosted voltage Vpp drops to this range, voltage V4 out of voltages V1 to V4 becomes smaller than reference voltage VccS. Thus, activation signal Sig4 goes from the L level to an H level. In response, oscillator OSC4 supplies drive signal Cact4 at frequency f4 to the charge pump circuit. Receiving this drive signal, charge pump circuit CP4 boosts the voltage of boosted node Np. When boosted voltage Vpp thus reaches (ΣR/rl)×VccS, activation signal Sig4 goes from the H level to the L level, and charge pump circuit CP4 finishes boosting.

when $$(\Sigma R/(r4+rl)) \times VccS > Vpp \geq (\Sigma R/(r3+r4+rl)) \times VccS: \quad (3)$$

i.e., when V2≧VccS>V3.

When the level of boosted voltage Vpp drops to this range, voltages V3 and V4 out of voltages V1 to V4 become smaller than reference voltage VccS. Thus, activation signals Sig3 and Sig4 out of activation signals Sig1 to Sig4 go from the L level to the H level. Receiving this activation signal Sig3, oscillator OSC3 supplies drive signal Cact3 at frequency f3 to charge pump circuit CP3. Oscillator OSC4 receives activation signal Sig4, and supplies drive signal Cact4 at frequency f4 to charge pump circuit CP4. As a result, the voltage at boosted node Np is boosted by charge pump circuits CP3 and CP4.

When boosted voltage Vpp thus reaches the range described above in (2), activation signal Sig3 goes from the H level to the L level, and charge pump circuit CP3 ends boosting operation. Thereafter, only charge pump circuit CP4 conducts boosting. When boosted voltage Vpp reaches the range set forth in (1), activation signal Sig4 goes from the H level to the L level, and charge pump circuit CP4 also finishes boosting.

when $$(\Sigma R/(r3+r4+rl)) \times VccS > Vpp \geq (\Sigma R/(r2+r3+r4+rl)) \times VccS: \quad (4)$$

i.e., when V1≧VccS>V2.

When boosted voltage Vpp drops to this range, voltages V2 to V4 out of voltages V1 to V4 become lower than reference voltage VccS. Thus, activation signals Sig2, Sig3 and Sig4 go from the L level to the H level. Correspondingly, oscillators OSC2 to OSC4 supply respective drive signals Cact2 to Cact4 at respective frequencies f2 to f4 to charge pump circuits CP2 to CP4, respectively. As a result, the voltage at boosted node Np is boosted by charge pump circuits CP2 to CP4. When boosted voltage Vpp thus reaches the range described above in (3), activation signal Sig2 goes from the H level to the L level, and charge pump circuit CP2 ends the boosting operation. Thereafter, charge pump circuits CP3 and CP4 conduct boosting. When boosted voltage Vpp reaches the range stated above in (2), activation signal Sig3 goes from the H level to the L level, and thus, charge pump circuit CP3 ends its boosting operation. Thereafter, charge pump circuit CP4 further conducts boosting. When boosted voltage Vpp reaches the range stated in (1), activation signal Sig4 goes from the H level to the L level, and charge pump circuit CP4 stops boosting operation. Thus, boosting of boosted voltage Vpp is finished.

when $$Vpp < (\Sigma R/(r2+r3+r4+rl)) \times VccS: \quad (5)$$

i.e., when VccS>V1.

When boosted voltage Vpp drops to this range, voltages V1 to V4 are all lower than reference voltage VccS. Thus, activation signals Sig1 to Sig4 all go from the L level to the H level. Correspondingly, oscillators OSC1 to OSC4 supply drive signals Cact1 to Cact4 at frequencies f1 to f4 to charge pump circuits CP1 to CP4, respectively. As a result, boosting of boosted voltage Vpp is conducted by all charge pump circuits CP1 to CP4.

When boosted voltage Vpp thus reaches the range described above in (4), activation signal Sig1 goes from the H level to the L level, and charge pump circuit CP1 finishes its boosting operation. Further, when boosted voltage Vpp reaches the range stated in (3), activation signal Sig2 goes from the H level to the L level, and thus, charge pump circuit CP2 ends its boosting operation. When boosted voltage Vpp reaches the range set forth in (2), activation signal Sig3 goes from the H level to the L level, and charge pump circuit CP3 stops boosting operation. Furthermore, when boosted voltage Vpp reaches the range described above in (1), activation signal Sig4 goes from the H level to the L level, and charge pump circuit CP4 ends its boosting operation. Boosting of boosted node Np is thus completed.

As explained above, this boosting circuit changes the number of charge pump circuits to be driven according to the degree of decrease in boosted voltage Vpp. Accordingly, it becomes possible to provide a stable boosted voltage with suppressing over shoot and under shoot with respect to the boosted voltage as a target.

It should be understood that, though resistors RU, R1 to R4 and RL have been used in this embodiment for dividing boosted voltage Vpp, a plurality of transistors connected in series between boosted node Np and ground node Vss may be used instead.

Second Embodiment

Figure 5:
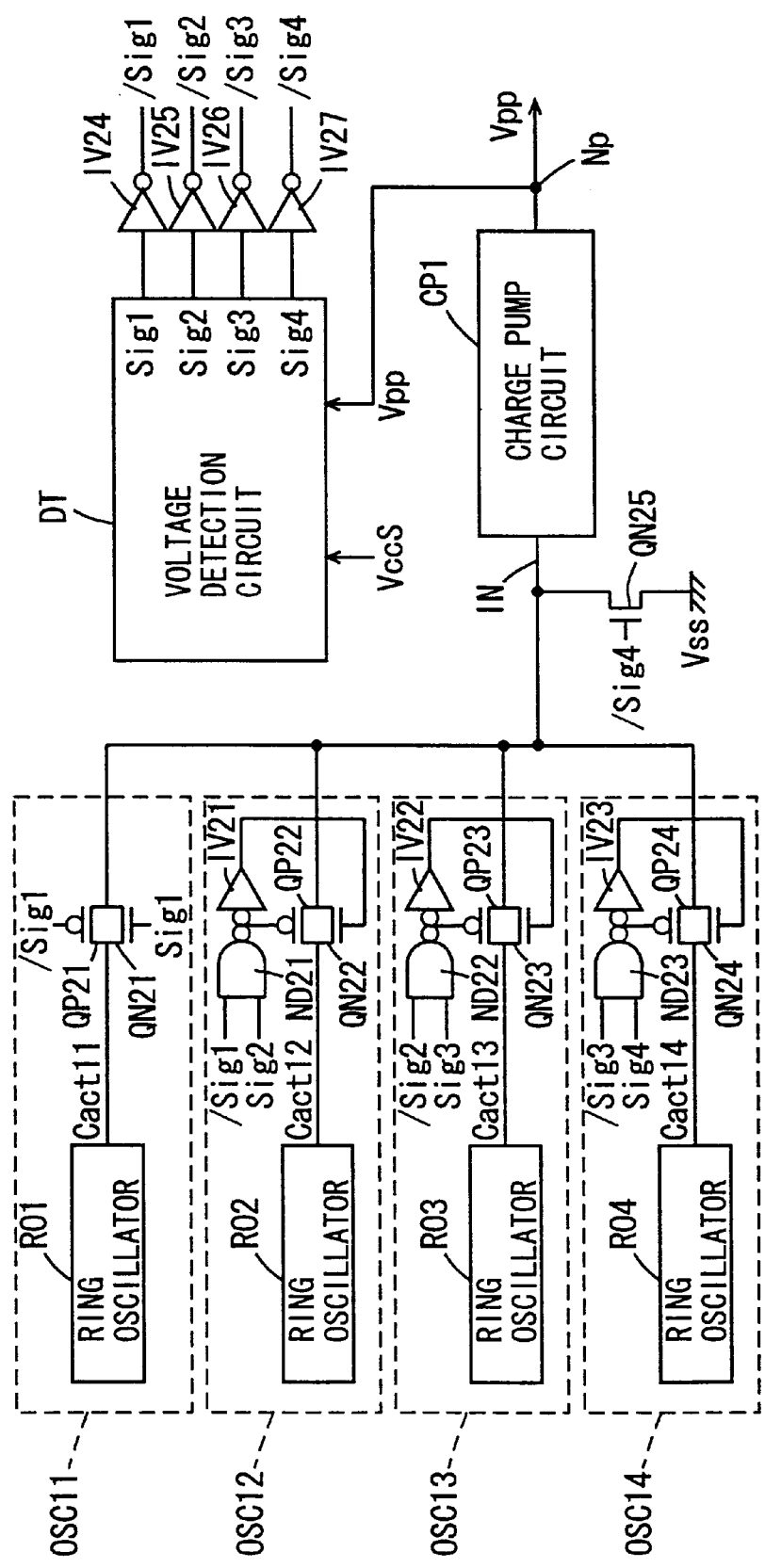
FIG. 5 is a block diagram showing an entire configuration of a boosting circuit according to the second embodiment of the present invention.

FIG. 5 is a block diagram showing an entire configuration of a boosting circuit according to the second embodiment of the present invention. Referring to FIG. 5, the boosting circuit includes a voltage detection circuit DT, inverters IV24 to IV27, oscillators OSC11 to OSC14, a charge pump circuit CP1, and an N channel MOS transistor QN25. The voltage detection circuit DT, which has a configuration identical to that of the voltage detection circuit shown in FIG. 2, receives boosted voltage Vpp and reference voltage VccS, and generates activation signals Sig1 to Sig4. Inverters IV24 to IV27 invert respective activation signals Sig1 to Sig4. Oscillator OSC11 includes a ring oscillator RO1, a P channel MOS transistor QP21, and an N channel MOS transistor QN21. Ring oscillator RO1 is composed of an odd number of stages of inverters, and generates a pulse signal Cact11 at frequency f1. P channel MOS transistor QP21 and N channel MOS transistor QN21 constitute a transfer gate, which is connected between ring oscillator RO1 and charge pump circuit CP1. P channel MOS transistor QP21 responds to activation signal/Sig1 to turn ON/OFF. N channel MOS transistor QN21 responds to activation signal Sig1 to turn ON/OFF. Oscillator OSC12 includes a ring oscillator RO2, a NAND circuit ND21, an inverter IV21, a P channel MOS transistor QP22, and an N channel MOS transistor QN22. Ring oscillator RO2 is composed of an odd number of stages of inverters, and generates a pulse signal Cact12 at frequency f2. NAND circuit ND21 provides the NAND of activation signals/Sig1 and Sig2. Inverter IV21 inverts an output of NAND circuit ND21. P channel MOS transistor QP22 and N channel MOS transistor QN22 constitute a transfer gate, which is connected between ring oscillator RO2 and charge pump circuit CP1. P channel MOS transistor QP22 responds to the output of NAND circuit ND21 to turn ON/OFF. N channel MOS transistor QN22 responds to the output of inverter IV21 to turn ON/OFF. Oscillator OSC13 includes a ring oscillator RO3, a NAND circuit ND22, an inverter IV22, a P channel MOS transistor QP23, and an N channel MOS transistor QN23. Ring oscillator RO3 is formed of an odd number of stages of inverters and generates a pulse signal Cact13 at frequency f3. NAND circuit ND22 provides the NAND of activation signals/Sig2 and Sig3. Inverter IV22 inverts the output of NAND circuit ND22. P channel MOS transistor QP23 and N channel MOS transistor QN23 constitute a transfer gate, which is connected between ring oscillator RO3 and charge pump circuit CP1. P channel MOS transistor QP23 responds to the output of NAND circuit ND22 to turn ON/OFF. N channel MOS transistor QN23 responds to the output of inverter IV22 to turn ON/OFF. Oscillator OSC14 includes a ring oscillator RO4, a NAND circuit ND23, an inverter IV23, a P channel MOS transistor QP24, and an N channel MOS transistor QN24. Ring oscillator RO4 is composed of an odd number of stages of inverters, and generates a pulse signal Cact14 at frequency f4. NAND circuit ND23 provides the NAND of activation signals/Sig3 and Sig4. Inverter IV23 inverts the output of NAND circuit ND23. P channel MOS transistor QP24 and N channel MOS transistor QN24 constitute a transfer gate, which is connected between ring oscillator RO4 and charge pump circuit CP1. P channel MOS transistor QP24 responds to the output of NAND circuit ND23 to turn ON/OFF. N channel MOS transistor QN24 responds to the output of inverter IV23 to turn ON/OFF. Frequencies f1 to f4 of respective pulse signals Cact11 to Cact14 have a relation of f1>f2>f3>f4, as in the first embodiment. N channel MOS transistor QN25 is connected between an input node of charge pump circuit CP1 and a ground node Vss, and turns ON/OFF in response to activation signal/Sig4. Charge pump circuit CP1 is activated in response to a signal applied to the input node IN, and boosts the voltage at boosted node Np. The configuration and operation of charge pump circuit CP1 are identical to those of charge pump circuit shown in FIG. 4. Therefore, the driving capability of charge pump circuit CP1 is the largest when it operates receiving pulse signal Cact11 at frequency f1, and is the smallest when it operates receiving pulse signal Cact14 at frequency f4.

Now, the operation of the boosting circuit having the above-described configuration will be described for the cases (1) to (5) set forth in the first embodiment.

In the case (1), as stated in the first embodiment, activation signals Sig1 to Sig4 generated by voltage detection circuit DT are all at an L level. Thus, P channel MOS transistors QP21 to QP24 and N channel MOS transistors QN21 to QN24 shown in FIG. 5 are all in an OFF state. N channel MOS transistor QN25 is in an ON state. Thus, charge pump circuit CP1 does not conduct boosting operation.

In the case (2), activation signal Sig4 goes from the L level to an H level, while activation signals Sig1 to Sig3 remain at the L level. Thus, the output of NAND circuit ND23 attains an L level, and P channel MOS transistor QP24 and N channel MOS transistor QN24 are turned ON. N channel MOS transistor QN25 is turned OFF. As a result, pulse signal Cact14 from ring oscillator RO4 is supplied to charge pump circuit CP1. Charge pump circuit CP1 boosts boosted voltage Vpp with a driving capability that is in accordance with the frequency of pulse signal Cact14.

Thereafter, when boosted voltage Vpp is boosted to the range stated in (1), activation signal Sig4 goes from the H level to the L level. Accordingly, P channel MOS transistor QP24 and N channel MOS transistor QN24 are turned OFF, and N channel MOS transistor QN25 is turned ON. Thus, charge pump circuit CP1 ends its boosting operation.

In the case (3), activation signals Sig3 and Sig4 go from the L level to the H level, while activation signals Sig1 and Sig2 remain at the L level. In response, the output of NAND circuit ND22 attains an L level, and P channel MOS transistor QP23 and N channel MOS transistor QN23 are turned ON. N channel MOS transistor QN25 is turned OFF. As a result, pulse signal Cact13 from ring oscillator RO3 is supplied to charge pump circuit CP1. Charge pump circuit CP1 boosts boosted voltage Vpp with a driving capability corresponding to the frequency of pulse signal Cact13.

Thereafter, when boosted voltage Vpp reaches the range stated in (2), activation signal Sig3 goes from the H level to the L level. In response, the output of NAND circuit ND22 attains an H level, and P channel MOS transistor QP23 and N channel MOS transistor QN23 are turned OFF. The output of NAND circuit ND23 goes from the H level to the L level, and thus, P channel MOS transistor QP24 and N channel MOS transistor QN24 turn ON. As a result, pulse signal Cact14 from ring oscillator RO4 is supplied to charge pump circuit CP1. Charge pump circuit CP1 boosts boosted voltage Vpp with a driving capability that is in accordance with pulse signal Cact14.

Furthermore, when boosted voltage Vpp reaches the range stated in (1), activation signal Sig4 goes from the H level to the L level. In response, P channel MOS transistor QP24 and N channel MOS transistor QN24 are turned OFF, and N channel MOS transistor QN25 is turned ON. Accordingly, charge pump circuit CP1 ends its boosting operation.

In the case (4), activation signals Sig2, Sig3 and Sig4 go from the L level to the H level. In response, the output of NAND circuit ND21 attains an H level, and P channel MOS transistor QP22 and N channel MOS transistor QN22 are turned ON. N channel MOS transistor QN25 is turned OFF. As a result, pulse signal Cact12 from ring oscillator RO2 is supplied to charge pump circuit CP1, which boosts boosted voltage Vpp with a driving capability in accordance with pulse signal Cact12.

Thereafter, when boosted voltage Vpp reaches the range stated in (3), activation signal Sig2 goes from the H level to the L level. In response, P channel MOS transistor QP22 and N channel MOS transistor QN22 are turned OFF, and P channel MOS transistor QP23 and N channel MOS transistor QN23 are turned ON. As a result, pulse signal Cact13 from ring oscillator RO3 is supplied to charge pump circuit CP1. Charge pump circuit CP1 boosts boosted voltage Vpp with a driving capability in accordance with pulse signal Cact13.

Thereafter, when boosted voltage Vpp reaches the range stated in (2), activation signal Sig3 goes from the H level to the L level. In response, P channel MOS transistor QP23 and N channel MOS transistor QN23 are turned OFF, and P channel MOS transistor QP24 and N channel MOS transistor QN24 are turned ON. As a result, pulse signal Cact14 from ring oscillator RO4 is supplied to charge pump circuit CP1. Charge pump circuit CP1 boosts boosted voltage Vpp with a driving capability in accordance with pulse signal Cact14.

Furthermore, when boosted voltage Vpp reaches the range stated in (1), activation signal Sig4 goes from the H level to the L level. In response, P channel MOS transistor QP24 and N channel MOS transistor QN24 are turned OFF, and P channel MOS transistor QP25 is turned ON. As a result, charge pump circuit CP1 finishes boosting operation.

In the case (5), activation signals Sig1 to Sig4 all attain the H level. In response, P channel MOS transistor QP21 and N channel MOS transistor QN21 are turned ON. N channel MOS transistor QN25 is turned OFF. As a result, pulse signal Cact11 from ring oscillator RO1 is supplied to charge pump circuit CP1. Charge pump circuit CP1 boosts boosted voltage Vpp with a driving capability in accordance with pulse signal Cact11.

Thereafter, when boosted voltage Vpp reaches the range stated in (4), activation signal Sig1 attains the L level. In response, P channel MOS transistor QP21 and N channel MOS transistor QN21 are turned OFF, and P channel MOS transistor QP22 and N channel MOS transistor QN22 are turned ON. As a result, pulse signal Cact12 from ring oscillator RO2 is supplied to charge pump circuit CP1, which boosts boosted voltage Vpp with a driving capability corresponding to pulse signal Cact12.

Further, when boosted voltage Vpp reaches the range stated in (3), activation signal Sig2 attains the L level. In response, P channel MOS transistor QP22 and N channel MOS transistor QN22 are turned OFF, and P channel MOS transistor QP23 and N channel MOS transistor QN23 are turned ON. As a result, pulse signal Cact13 from ring oscillator RO3 is supplied to charge pump circuit CP1, and charge pump circuit CP1 boosts boosted voltage Vpp with a driving capability that is in accordance with pulse signal Cact13.

Thereafter, when boosted voltage Vpp reaches the range stated in (2), activation signal Sig3 attains the L level. In response, P channel MOS transistor QP23 and N channel MOS transistor QN23 are turned OFF, and P channel MOS transistor QP24 and N channel MOS transistor QN24 are turned ON. As a result, pulse signal Cact14 from ring oscillator RO4 is supplied to charge pump circuit CP1. Charge pump circuit CP1 boosts boosted voltage Vpp with a driving capability in accordance with pulse signal Cact14.

Furthermore, when boosted voltage Vpp reaches the range stated in (1), activation signal Sig4 attains the L level. In response, P channel MOS transistor QP24 and N channel MOS transistor QN24 are turned OFF, and N channel MOS transistor QN25 is turned ON. As a result, charge pump circuit CP1 ends its boosting operation.

As explained above, according to the second embodiment, charge pump circuit CP1 conducts boosting operation with a driving capability that is in accordance with a respective pulse signal Cact11 to Cact14. Accordingly, it is possible to suppress over shoot and under shoot with respect to a boosted voltage as a target, and thus to supply a stable boosted voltage.

In addition, chip area can be reduced because only one charge pump circuit is necessary.

Third Embodiment

Figure 6:
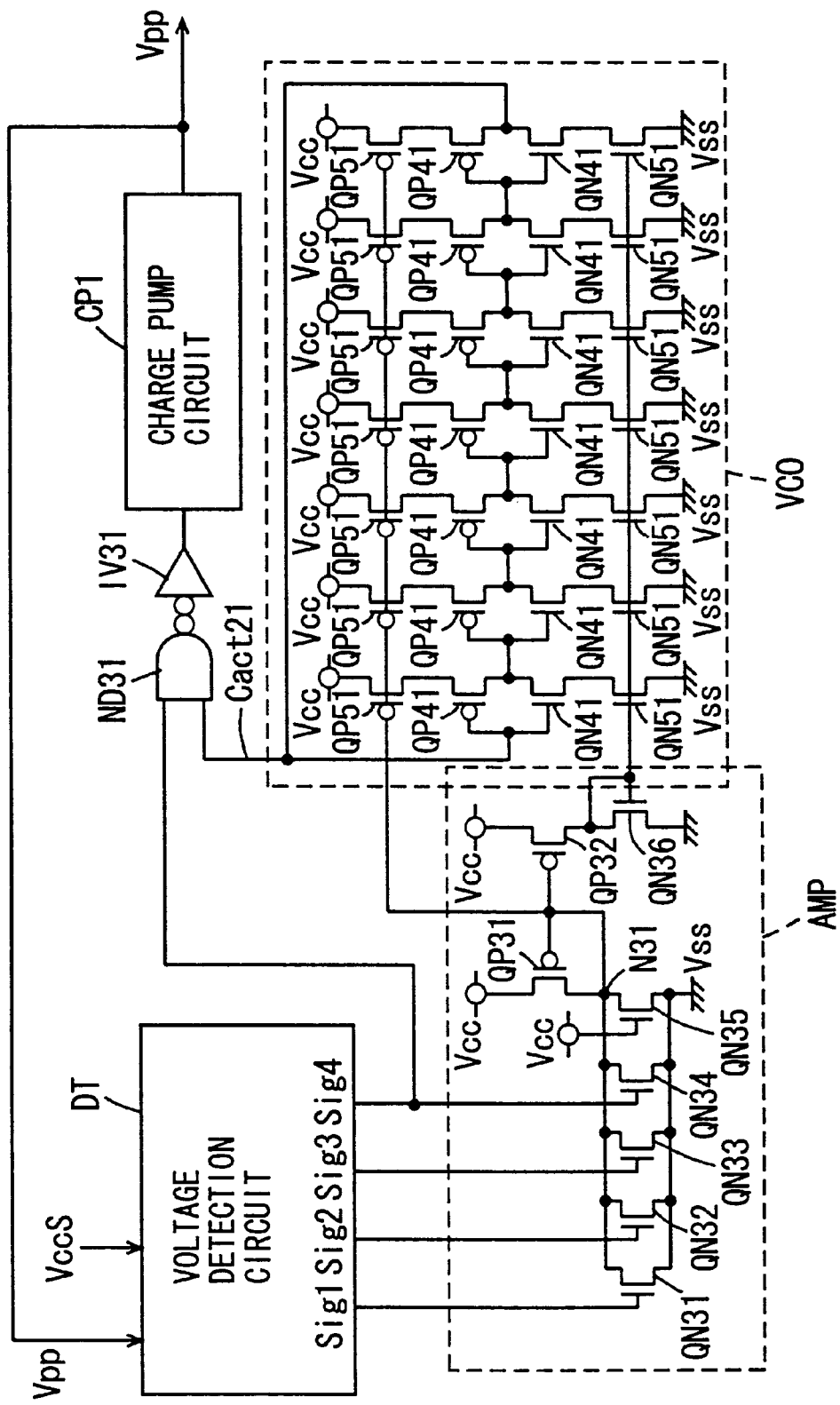
FIG. 6 is a block diagram showing an entire configuration of a boosting circuit according to the third embodiment of the present invention.
Figure 7:
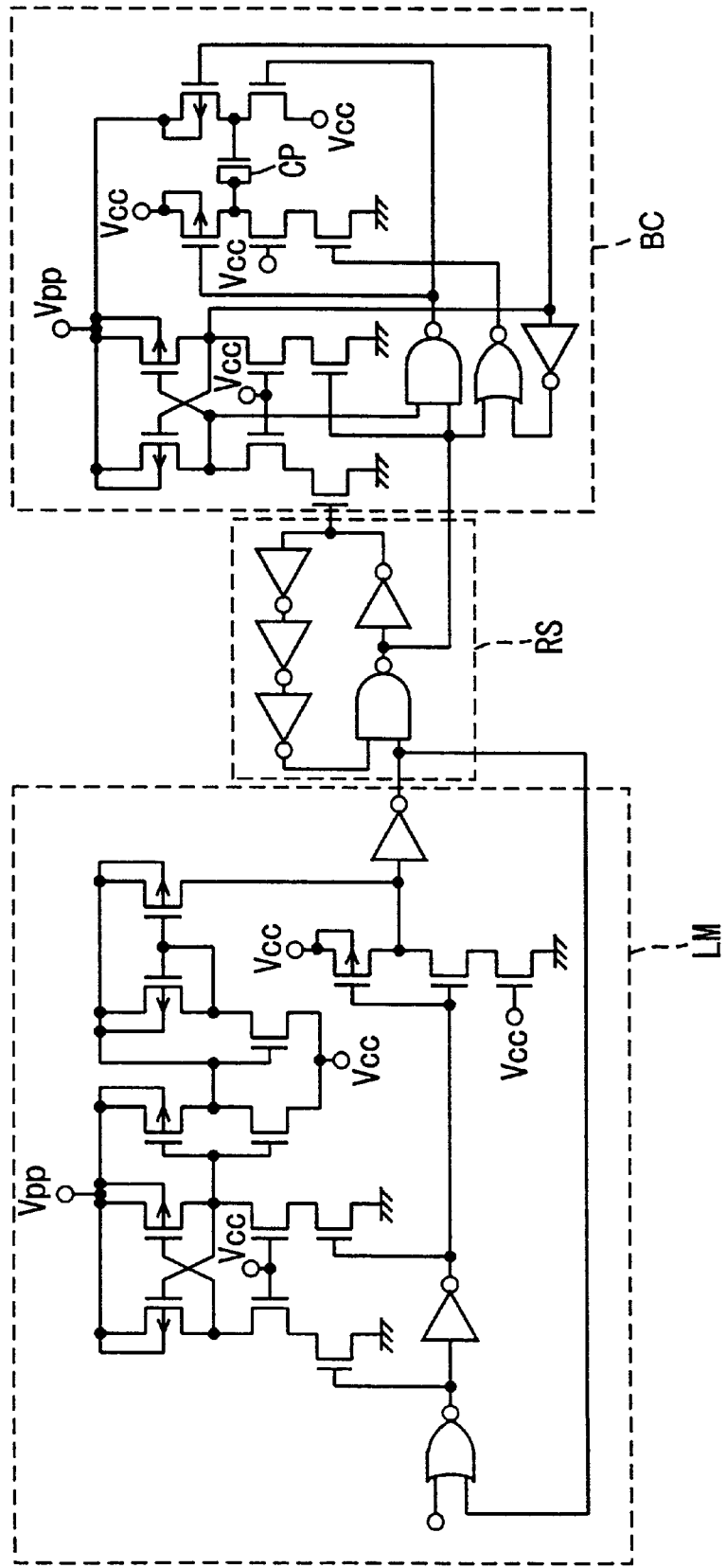
FIG. 7 is a block diagram showing a configuration of a conventional boosting circuit.

FIG. 6 is a block diagram showing an entire configuration of a boosting circuit according to the third embodiment of the present invention. Referring to FIG. 6, the boosting circuit includes a voltage detection circuit DT, a differential amplifying circuit AMP, a voltage controlled type oscillating circuit VCO, a NAND circuit ND31, an inverter IV31, and a charge pump circuit CP1.

Voltage detection circuit DT, having a configuration identical to that of the voltage detection circuit shown in FIG. 2, receives boosted voltage Vpp and reference voltage VccS, and generates activation signals Sig1 to Sig4.

Differential amplifying circuit AMP includes P channel MOS transistors QP31 and QP32, and N channel MOS transistors QN31 to QN36. P channel MOS transistor QP31 and N channel MOS transistor QN35 are connected in series between power supply node Vcc and ground node Vss. P channel MOS transistor QP31 has its gate connected to a drain of its own. N channel MOS transistor QN35 receives power supply voltage Vcc at its gate. P channel MOS transistor QP32 and N channel MOS transistor QN36 are connected in series between power supply node Vcc and ground node Vss, and in parallel with P channel MOS transistor QP31. P channel MOS transistor QP32 has its gate connected to the gate of P channel MOS transistor QP31. N channel MOS transistor QN36 has its gate connected to a drain of its own. N channel MOS transistors QN31 to QN34 are connected between a node N31 and ground node Vss in parallel with N channel MOS transistor QN35, and have their gates receiving activation signals Sig1 to Sig4, respectively. P channel MOS transistor QP31 and P channel MOS transistor QP32, and N channel MOS transistors QN31 to QN35 and N channel MOS transistor QN36 constitute current mirror structures, respectively. Furthermore, P channel MOS transistor QP31 and P channel MOS transistor QP51, and N channel MOS transistor QN36 and N channel MOS transistor QN51 constitute current mirror structures, respectively.

Voltage controlled type oscillating circuit VCO includes a ring oscillator having 7 stages of clocked inverters connected in a ring shape, each clocked inverter being composed of P channel MOS transistors QP41 and QP51 and N channel MOS transistors QN41 and QN51. These clocked inverters have driving capabilities altering dependent on the amount of current flowing through P channel MOS transistor QP51 and N channel MOS transistor QN51. The frequency of pulse signal Cact21 also changes.

NAND circuit ND31 provides the NAND of pulse signal Cact21 output from the ring oscillator included in voltage controlled type oscillating circuit VCO and activation signal Sig4. Inverter IV31 inverts the output of NAND circuit ND31. Charge pump circuit CP1 responds to the output of inverter IV31 and boosts boosted voltage Vpp.

Now, the operation of the boosting circuit having the above-described configuration will be described for the cases (1) to (5) set forth in the first embodiment.

In the case (1), as in the first embodiment, activation signals Sig1 to Sig4 output from voltage detection circuit DT are all at an L level, and thus, the output of NAND circuit ND31 shown in FIG. 6 is at an H level, and the output of inverter IV31 is at an L level. Accordingly, charge pump circuit CP1 performs no boosting operation.

In the case (2), activation signal Sig4 goes from the L level to an H level, while activation signals Sig1 to Sig3 remain at the L level. Thus, N channel MOS transistor QN34 is turned ON. At this time, due to the function of the current mirror structure, P channel MOS transistor QP51 and N channel MOS transistor QN51 are turned ON with a strength that allows a current to flow through P channel MOS transistor QP51 and N channel MOS transistor QN51 with an amount corresponding to that of the current flowing through P channel MOS transistor QP31 and N channel MOS transistors QN34 and QN35. Accordingly, P channel MOS transistor QP51 and N channel MOS transistor QN51 are turned ON to a certain level that depends on the strength of the current flowing through P channel MOS transistor QP51 and N channel MOS transistor QN51. As a result, pulse signal Cact21 at frequency f14 is input to NAND circuit 31. Since activation signal Sig4 is at the H level, pulse signal Cact21 is supplied via inverter IV31 to charge pump circuit CP1. Charge pump circuit CP1 boosts boosted voltage Vpp with a driving capability that is in accordance with frequency f14 of pulse signal Cact21.

Thereafter, when boosted voltage Vpp is boosted to the range stated in (1), activation signal Sig4 goes from the H level to the L level, and in response, the output of NAND circuit 31 attains an H level, and the output of inverter IV31 attains an L level. Thus, charge pump circuit CP1 ends boosting operation.

In the case (3), activation signals Sig3 and Sig4 go from the L level to the H level. Accordingly, N channel MOS transistors QN33 and QN34 are turned ON. The current flowing through P channel MOS transistor QP31 and N channel MOS transistors QN33 to QN35 becomes larger than in the case of (2). At this time, due to the function of current mirror structure, P channel MOS transistor QP51 and N channel MOS transistor QN51 attain an ON state that is stronger than in the case of (2). As a result, pulse signal Cact21 at frequency f13 that is higher than frequency f14 is provided to NAND circuit 31. Pulse signal Cact21 is supplied via inverter IV31 to charge pump circuit CP1, since activation signal Sig4 is at the H level. Charge pump circuit CP1 boosts boosted voltage Vpp with a driving capability that is in accordance with frequency f13 of pulse signal Cact21; i.e., the driving capability greater than in the case of (2).

Thereafter, when boosted voltage Vpp reaches the range stated in (2), activation signal Sig3 goes from the H level to the L level. In response, N channel MOS transistor QN33 is turned OFF. Accordingly, the frequency of pulse signal Cact21 is changed from f13 to f14. Charge pump circuit CP1 thus boosts boosted voltage Vpp with a driving capability in accordance with frequency f14 of pulse signal Cact21.

Thereafter, when boosted voltage Vpp is boosted to the range stated in (1), activation signal Sig4 goes from the H level to the L level. In response, the output of NAND circuit ND31 attains an H level, and the output of inverter IV31 attains an L level. Accordingly, charge pump circuit CP1 finishes boosting operation.

In the case (4), activation signals Sig2 to Sig4 go from the L level to the H level. Accordingly, N channel MOS transistors QN32 to QN34 are turned ON. The current flowing through P channel MOS transistor QP31 and N channel MOS transistors QN32 to QN35 becomes larger than in the case of (3). At this time, P channel MOS transistor QP51 and N channel MOS transistor QN51 attain a stronger ON state than in the case of (3), due to the function of current mirror structure. As a result, pulse signal Cact21 at frequency f12 that is higher than frequency f13 is input to NAND circuit 31. Since activation signal Sig4 is at the H level, pulse signal Cact21 is supplied to charge pump circuit CP1 via inverter IV31. Charge pump circuit CP1 boosts boosted voltage Vpp with a driving capability that is in accordance with frequency f12 of pulse signal Cact21; i.e., the driving capability larger than in the case of (3).

Thereafter, when boosted voltage Vpp reaches the range stated in (3), activation signal Sig2 goes from the H level to the L level. In response, N channel MOS transistor QN32 is turned OFF. Accordingly, the frequency of pulse signal Cact21 changes from f12 to f13. Charge pump circuit CP1 boosts boosted voltage Vpp with a driving capability in accordance with frequency f13 of pulse signal Cact21.

Further, when boosted voltage Vpp reaches the range stated in (2), activation signal Sig3 goes from the H level to the L level. In response, N channel MOS transistor QN33 is turned OFF. Accordingly, the frequency of pulse signal Cact21 changes from f13 to f14. Charge pump circuit CP1 boosts boosted voltage Vpp with a driving capability in accordance with frequency f14 of pulse signal Cact21.

Thereafter, when boosted voltage Vpp is boosted to the range stated in (1), activation signal Sig4 goes from the H level to the L level. In response, the output of NAND circuit ND31 attains an H level, and the output of inverter IV31 attains an L level. Accordingly, charge pump circuit CP1 finishes boosting operation.

In the case (5), activation signals Sig1 to Sig4 all go from the L level to the H level. Thus, N channel MOS transistors QN31 to QN34 are turned ON. The current flowing through P channel MOS transistor QP31 and N channel MOS transistors QN31 to QN35 becomes larger than in the case of (4). At this time, P channel MOS transistor QP51 and N channel MOS transistor QN51 both attain a stronger ON state than in the case of (4) due to the function of current mirror structure. As a result, pulse signal Cact21 at frequency f11 that is higher than frequency f12 is input to NAND circuit 31. Since activation signal Sig4 is at the H level, pulse signal Cact21 is supplied to charge pump circuit CP1 via inverter IV31. Charge pump circuit CP1 boosts boosted voltage Vpp with a driving capability that is in accordance with frequency f11 of pulse signal Cact21; i.e., the driving capability larger than in the case of (4).

Thereafter, when boosted voltage Vpp reaches the range stated in (4), activation signal Sig1 goes from the H level to the L level. In response, N channel MOS transistor QN31 is turned OFF. Accordingly, the frequency of pulse signal Cact21 changes from f11 to f12. Charge pump circuit CP1 boosts boosted voltage Vpp with a driving capability in accordance with frequency f12 of pulse signal Cact21.

Further, when boosted voltage Vpp reaches the range stated in (3), activation signal Sig2 goes from the H level to the L level. In response, N channel MOS transistor QN32 is turned OFF. Accordingly, the frequency of pulse signal Cact21 changes from f12 to f13. Charge pump circuit CP1 boosts boosted voltage Vpp with a driving capability that is in accordance with frequency f13 of pulse signal Cact21.

Furthermore, when boosted voltage Vpp reaches the range stated in (2), activation signal Sig3 goes from the H level to the L level. In response, N channel MOS transistor QN33 is turned OFF. Accordingly, the frequency of pulse signal Cact21 changes from f13 to f14. Charge pump circuit CP1 boosts boosted voltage Vpp with a driving capability in accordance with frequency f14 of pulse signal Cact21.

Thereafter, when boosted voltage Vpp is boosted to the range stated in (1), activation signal Sig4 goes from the H level to the L level. In response, the output of NAND circuit ND31 attains an H level, and the output of inverter IV31 attains an L level. Thus, charge pump circuit CP1 finishes boosting operation.

As described above, according to the third embodiment, differential amplifying circuit AMP and voltage controlled type oscillating circuit VCO have been provided, and thus, charge pump circuit CP1 conducts boosting operation with a driving capability that is in accordance with a respective frequency f11 to f14 of pulse signal Cact21. As a result, it is possible to provide a stable boosted voltage, with suppressing over shoot and under shoot with respect to the boosted voltage as a target.

Further, chip area can be reduced since only one charge pump circuit is provided.

Moreover, a single voltage controlled type oscillating circuit VCO can generate pulse signals Cact21 with different frequencies f11 to f14. Accordingly, chip area can further be reduced compared with the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A boosting circuit, comprising:
   (a) a boosted node receiving a voltage higher than a power supply voltage;
   (b) a voltage detection circuit, receiving said voltage from the boosted node and a reference voltage, said voltage detection circuit including:
      a voltage divider receiving the voltage of said boosted node, generating a plurality of voltages lower than the voltage of said boosted nodes, and outputting said plurality of voltages respectively to a plurality of output nodes, wherein said plurality of voltages are different from each other; and
      a plurality of comparators respectively corresponding to said plurality of voltages from said plurality of output nodes of said voltage divider, each comparator comparing a corresponding voltage with said reference voltage to generate an activation signal when the corresponding voltage is lower than said reference voltage; and
   (c) a booster circuit boosting the voltage of said boosted node in response to the activation signal from one of said plurality of comparators.

2. The boosting circuit according to claim 1, wherein said power supply voltage is commonly provided to said plurality of comparators as said reference voltage.

3. The boosting circuit according to claim 1, wherein said voltage divider includes a plurality of resistors connected in series between said boosted node and a ground node.

4. The boosting circuit according to claim 1, wherein said voltage divider includes a plurality of transistors connected in series between said boosted node and a ground node.

5. The boosting circuit according to claim 1, wherein said booster circuit includes
   a plurality of oscillating circuits corresponding to said plurality of comparators, each responsive to an activation signal from a corresponding comparator to output a pulse signal, and
   a plurality of charge pump circuits corresponding to said plurality of oscillating circuits, each responsive to the pulse signal from a corresponding oscillating circuit to boost the voltage of said boosted node.

6. The boosting circuit according to claim 5, wherein said plurality of oscillating circuits output pulse signals different in frequency from each other.

7. The boosting circuit according to claim 1, wherein said booster circuit includes
   a plurality of oscillating circuits corresponding to said plurality of comparators, each responsive to an activation signal from a corresponding comparator to output a pulse signal, and
   a charge pump circuit responsive to the pulse signal from one of said plurality of oscillating circuits to boost the voltage of said boosted node.

8. The boosting circuit according to claim 7, wherein said plurality of oscillating circuits output pulse signals different in frequency from each other.

9. The boosting circuit according to claim 1, wherein said booster circuit includes
   a ring oscillator including a plurality of inverters to output a pulse signal,
   a control circuit responsive to said activation signal to control a driving current of at least one of said plurality of inverters, and
   a charge pump circuit responsive to the pulse signal from said ring oscillator to boost the voltage of said boosted node.

10. The boosting circuit according to claim 9, wherein said control circuit includes:
    a first P channel MOS transistor and a first N channel MOS transistor connected in series between a power supply node and a ground node, said first P channel MOS transistor being connected to said power supply node, said first N channel MOS transistor being connected to said ground node, and having a gate and a drain connected to each other,
    a second P channel MOS transistor connected to the power supply node, and having a gate and a drain connected to each other, the gate of said second P channel MOS transistor being connected to the gate of said first P channel MOS transistor, and
    a plurality of N channel MOS transistors corresponding to said plurality of comparators, each connected in series with said second P channel MOS transistor between said second P channel MOS transistor and the ground node and connected in parallel with each other, and being turned on/off in response to a corresponding activation signal; and
    each of said plurality of inverters includes
      an input node,
      an output node,
      a third P channel MOS transistor connected between the power supply node and the output node and having a gate receiving a voltage of the input node,
      a fourth P channel MOS transistor connected in series with said third P channel MOS transistor between the power supply node and the output node, and having a gate connected to the gate of said second P channel MOS transistor,
      a second N channel MOS transistor connected between the output node and the ground node, and having a gate receiving a voltage of the input node, and
      a third N channel MOS transistor connected in series with said second N channel MOS transistor between the output node and the ground node, and having a gate connected to the gate of said first N channel MOS transistor.

11. The boosting circuit according to claim 1, wherein a driving capability of said booster circuit changes in accordance with the activation signals.

* * * * *